United States Patent [19]

Itokawa et al.

[11] Patent Number: 5,753,722
[45] Date of Patent: May 19, 1998

[54] PHOTOCURABLE AND THERMOSETTING MATTE LIQUID RESIST COMPOSITION

[75] Inventors: Gen Itokawa, Hanno; Koji Kurihara, Kawagoe; Nariaki Kurabayashi, Yorii-machi, all of Japan

[73] Assignee: Taiyo Ink Manufacturing Co., Ltd., Japan

[21] Appl. No.: 762,714

[22] Filed: Dec. 10, 1996

[30] Foreign Application Priority Data

Dec. 13, 1995 [JP] Japan ................................. 7-346255

[51] Int. Cl.⁶ ............................................................ C08J 3/28
[52] U.S. Cl. ............................. 522/83; 522/129; 522/146
[58] Field of Search ............................... 522/83, 146, 129

[56] References Cited

U.S. PATENT DOCUMENTS 5,183,831  2/1993  Bielat et al. ............................... 522/92
5,596,023  1/1997  Tsubota et al. ........................... 522/100

*Primary Examiner*—Melvyn I. Marquis
*Attorney, Agent, or Firm*—Ronald P. Kananen

[57] ABSTRACT

A photocurable and thermosetting matte liquid resist composition developable with an aqueous alkali solution is disclosed. The composition comprises in combination (A) a photosensitive prepolymer having a carboxyl group in combination with at least two ethylenically unsaturated bonds in the molecular unit thereof, (B) a photopolymerization initiator, (C) a diluent, (D) an epoxy compound having at least two epoxy groups in the molecular unit thereof, and further (E) a finely pulverized aluminum silicate matting agent in combination with (F) a filler precipitation preventing agent capable of effective thixotropic adjustment in the composition. The composition may further comprise (G) an epoxy resin curing agent. The composition can be advantageously used for the formation of a solder resist on a printed circuit board.

17 Claims, No Drawings

PHOTOCURABLE AND THERMOSETTING MATTE LIQUID RESIST COMPOSITION

BACKGROUND OF THE INVENTION

1. Field of the Invention

This invention relates to a photocurable and thermosetting liquid resist composition capable of forming a matte resist film of low gloss and more particularly to a matte liquid resist composition developable with an aqueous alkali solution and suitable for the formation of a solder resist on household or industrial printed circuit boards.

2. Description of the Prior Art

In recent years, owing to the trend of printed circuit boards toward patterns of growing fineness, the adhesion of solder, usually in the form of balls ranging from about 0.1 to 15 mils in diameter or chains of solder balls, to the resist film which occurs during the course of floating the board on molten solder, i.e. wave soldering process, forms a major cause for inducing such defects as bridges. It is known to the art that the formation of a film of resist ink having a matte surface for the purpose of precluding these defects is effective in enhancing the resistance of the resist ink film to adhesion of solder during the course of wave soldering and precluding the adhesion of produced solder balls thereto. The matte resist ink compositions of this class heretofore well known to the art are such that are formed by the incorporation of such fillers as ultrafine particles of anhydrous silica and talc or such a filler as molten silica particles of a large particle diameter as a matting component.

In the case of a matte resist ink using the ultrafine particles of hydrous silica as a filler, though the interaction of silanol groups on the surfaces of the particles binds the particles in a reticular pattern and gives rise to a matte surface, the incorporation of the ultrafine particles of anhydrous silica augments thixotropy and consequently induces the resist ink to emit bubbles and raise skips during the course of printing and eventually entails a clear decline in adaptability of the resist ink for printing. This resist ink is at a disadvantage in failing to manifest stable printability because such phenomena as the wetting with a diluent and the absorption of moisture during the course of printing cause the thixotropy to alter with the elapse of time.

In contrast, in the case of the matte resist ink using the talc as a filler, though the structure of flat particles of talc lends itself to the formation of an excellent matte surface, the incorporation of talc similarly to that of the ultrafine particles of anhydrous silica augments thixotropy and induces the resist ink to emit bubbles and raise skips during the course of printing and eventually degrades the adaptability of the resist ink for printing. Further, the alteration with time of thixotropy caused by such phenomena as the wetting with the diluent and the absorption of moisture during the course of printing prevents lasting manifestation of stable printability. This resist ink also has the problem of being incapable of producing a film of fully satisfactory surface hardness because the filler has low hardness.

Then, in the case of the matte resist ink using such a filler as molten silica of large particle diameters, though a matte surface is obtained by the incorporation of the filler having an average particle diameter of ½ to 1 times the thickness which the applied film is required to assume after drying, the film, when formed in an unduly small thickness, fails to acquire a matte surface because of the large particle diameters, produces raise spots liable to induce infiltration of such extraneous matter as moisture and chemicals along the interface between the filler and the resin matrix until the surface of the substrate, and betrays deficiency in reliability of the film as in terms of resistance to chemicals and electrical insulating properties. This resist ink is also at a disadvantage in failing to satisfy the need for fine patterns on account of the large particle diameters of the filler.

SUMMARY OF THE INVENTION

An object of the present invention, therefore, is to provide at a low cost a photocurable and thermosetting liquid resist composition which manifests excellent stable printability stably after protracted storage and in spite of aging, excels in ability to form fine patterns, retains low gloss of the film, and is useful for the formation of a matte resist film excelling in such film properties as resistance to adhesion of solder during the course of wave soldering, resistance to chemicals, resistance to the action of electroless gold plating, electrical insulating properties, resistance to heat, fastness of adhesion to the board, and hardness.

To accomplish the object, the present invention provides a photocurable and thermosetting matte liquid resist composition developable with an aqueous alkali solution, characterized by containing (E) a finely pulverized aluminum silicate matting agent in combination with (F) a filler precipitation preventing agent capable of effective thixotropic adjustment in a resin composition comprising (A) a photosensitive prepolymer having a carboxyl group in combination with at least two ethylenically unsaturated bonds in the molecular unit thereof, (B) a photopolymerization initiator, (C) a diluent, and (D) an epoxy compound having at least two epoxy groups in the molecular unit thereof.

Appropriately, the matting agent (E) is aluminum silicate having an average primary particle diameter from 0.05 to 10 µm and the ratio of incorporation thereof is in the range of 25 to 250 parts by weight, based on 100 parts by weight of the photosensitive prepolymer (A). The filler precipitation preventing agent (F) appropriately is organic bentonite having montmorillonite as a main component thereof.

DETAILED DESCRIPTION OF THE INVENTION

The present inventors, after pursuing a diligent study with a view to attaining the object mentioned above, have found that the combined use of a finely pulverized aluminum silicate matting agent and a filler precipitation preventing agent capable of effective thixotropic adjustment permits provision of a resist ink retaining stable printability in spite of aging and that the use of this resist ink allows formation of a resist film manifesting low gloss stably even after a protracted storage and excelling in resistance to adhesion of solder to the resist film during the course of wave soldering, resistance to chemicals, and adaptability for fine patterns.

The conventional composition using ultrafine particles of anhydrous silica or talc as a matting component thereof indeed allows production of a good matte film at a low application rate (in the approximate range of 5 to 20 parts by weight, based on 100 parts by weight of a photosensitive prepolymer). The incorporation of this component, however, augments thixotropy and consequently degrades the printability and further brings about a discernible alteration of thixotropy with time because of such phenomena as the wetting with a diluent and the absorption of moisture during the course of printing.

The photocurable and thermosetting matte liquid resist composition according to the present invention, in contrast to the conventional composition, uses a finely pulverized aluminum silicate matting agent as a matting component and, at the same time, incorporates the aluminum silicate matting agent therein in a large amount (from 25 to 250 parts by weight, preferably from 50 to 150 parts by weight, based on 100 parts by weight of the photosensitive prepolymer) and, as a result, manifests perfect stable printability in spite of aging without augmenting thixotropy of the composition, and produces a matte resist surface on a par with that which is obtained by the conventional composition. It is inferred that the matte surface is produced because the increase of the matting agent (filler) content results in heightening the filler distribution in the surface layer of the coating film and inducing physical formation of microfine rises and falls of the film surface with filler particle diameters after drying. The improved printability is explained by a supposition that the high filler content permits formation of a film of a macroscopically smooth surface and, at the same time, the use of aluminum silicate having a low $SiO_2$ content represses the growth of thixotropy due to the interaction between silanol groups.

When the aluminum silicate matting agent is used alone, however, the composition, though capable of forming an excellent matte film in the early stage of life, suffers growth of gloss to the extent of failing to produce a stably delustered surface after a protracted storage or during the formation of the film in unduly large thickness. This phenomenon may be logically explained by supposing that the sedimentation of the matting agent or flatting agent (filler) causes a decline of the distribution of the filler component in the surface layer of the resist film.

The photocurable and thermosetting matte liquid resist composition of the present invention, therefore, resorts to the combined use of a finely pulverized aluminum silicate matting agent and a filler precipitation preventing agent or anti-settling agent capable of effective thixotropy adjustment. The copresence of these agents represses the alteration of thixotropy of the composition and enables the resist composition to retain uniform dispersion of the filler and the vehicle for a long time after its preparation, to manifest stable printability, and to permit formation of the resist film of a stable matte surface even after a protracted storage. The matte state of the surface effectively prevents the resist film from adhesion of solder thereto during the course of wave soldering and, as a result, the film acquires an excellent resistance to adhesion of solder.

Further, the resist composition of the present invention excels in film reliability in terms of resistance to chemicals, resistance to electroless gold plating, electrical insulating properties, and fastness of adhesion to a substrate as compared with the conventional composition using a filler of coarse particles. The high film reliability may be logically explained by supposing that the use of the matting agent (filler) of fine particles renders difficult the otherwise ready infiltration of such extraneous matter as water and chemicals along the interface between the filler and the vehicle. Owing to the fineness of particle diameters, the composition also excels in the ability to form fine patterns. Further, by increasing the content of the aluminum silicate matting agent (filler) less expensive than a vehicle, the photocurable and thermosetting matte liquid resist composition is allowed to be provided at a low cost as compared with the conventional composition. Besides, the gloss of the resist film can be controlled without a sacrifice of any of the properties mentioned above by adjusting the amount of the matting agent to be added.

Now, the components of the photocurable and thermosetting matte liquid resist composition of the present invention will be described in detail below.

First, as the component (A) mentioned above, namely the photosensitive prepolymer (oligomer or polymer) having a carboxyl group in combination with at least two ethylenically unsaturated bonds in the molecular unit thereof, there can be used such unsaturated group-containing polycarboxylic acid resins as (1) products obtained by the esterification (complete esterification or partial esterification, preferably complete esterification) of the epoxy group of (a) a polyfunctional epoxy compound having at least two epoxy groups in the molecular unit thereof with the carboxyl group of (b) an unsaturated monocarboxylic acid and the subsequent reaction of (c) a saturated or unsaturated polybasic acid anhydride with the resultant hydroxyl group, (2) products obtained by the reaction of (meth)acrylic acid with a copolymer composed of an alkyl (meth)acrylate and a glycidyl (meth)acrylate and the subsequent reaction of (c) a saturated or unsaturated polybasic acid anhydride with the resultant reaction product, (3) products obtained by the reaction of (meth)acrylic acid with a copolymer composed of a hydroxyalkyl (meth)acrylate, an alkyl (meth)acrylate, and a glycidyl (meth)acrylate and the subsequent reaction of (c) a saturated or unsaturated polybasic acid anhydride with the resultant product, (4) products obtained by the partial reaction of a glycidyl (meth)acrylate with a copolymer composed of an alkyl (meth)acrylate and (meth)acrylic acid, (5) products obtained by causing (c) a saturated or unsaturated polybasic acid anhydride to react with (I) the reaction product of (a) a polyfunctional epoxy compound having at least two epoxy groups in the molecular unit thereof, (b) an unsaturated monocarboxylic acid, and (d) a compound having at least two hydroxyl groups and one other reactive group other than a hydroxyl group capable of reacting with an epoxy group in the molecular unit thereof, and (6) products obtained by causing a hydroxyalkyl (meth) acrylate to react with a copolymer of such an unsaturated polybasic acid anhydride as maleic anhydride with an aromatic hydrocarbon having a vinyl group such as styrene and such unsaturated group-containing polyurethane carboxylate resins as (7) products obtained by reacting (I) the reaction product mentioned above with (c) a saturated or unsaturated polybasic acid anhydride and (e) an unsaturated group-containing monoisocyanate.

The term "(meth)acrylic acid" as used in this specification means acrylic acid, methacrylic acid, or a mixture thereof and the term "(meth)acrylate" means acrylate, methacrylate, or a mixture thereof.

Since the photosensitive prepolymer (A) mentioned above has numerous free carboxyl groups added to the side chain of a backbone polymer, the composition containing this photosenitive prepolymer is developable with a dilute aqueous alkali solution. When the applied coating film of the composition is developed after exposure to light and then postcured, the addition reaction of the epoxy groups of an epoxy compound (D) separately added to the composition as a thermosetting component with the free carboxyl groups in the side chain of the photosensitive prepolymer takes place and the coating film is converted into a solder resist film excellent in such properties as heat resistance, solvent resistance, acid resistance, adhesiveness to a substrate, resistance to electroless gold plating, electrical properties, and hardness.

The acid value of the photosensitive prepolymer (A) mentioned above, though having an appropriate range thereof varied with the kind of prepolymer, should fall in the range of 30 to 160 mg KOH/g, preferably in the range of 40 to 120 mg KOH/g. Any deviation of the acid value from the aforementioned range is undesirable because the resin will manifest insufficient solubility in an aqueous alkali solution if the acid value is less than 30 mg KOH/g. Conversely, the acid value exceeding 160 mg KOH/g will give cause to deteriorate the various properties of the cured film such as resistance to alkalis and electrical properties expected of a resist.

The resin (1) mentioned above is obtained by causing the product of the reaction of such a polyfunctional epoxy compound as will be specifically described hereinafter with an unsaturated monocarboxylic acid to react with such a dibasic acid anhydride as phthalic anhydride or such an aromatic polycarboxylic anhydride as trimellitic anhydride or pyromellitic anhydride. In this case, the resin obtained by the reaction of at least 0.15 mol of a polybacic acid anhydride with each of the hydroxyl groups possessed by the reaction product of the polyfunctional epoxy compound with an unsaturated monocarboxylic acid proves to be suitable. When the number of ethylenically unsaturated bonds present in the molecular unit of the resin is small, the produced composition has a low speed of photocuring. It is therefore desired to use a novolak type epoxy compound as the raw material. A bisphenol A type epoxy resin may be used in combination therewith for the purpose of lowering the viscosity of the composition.

The copolymers which are base polymers of the resins (2) and (3) mentioned above are obtained by using as monomers such alkyl (meth)acrylates and glycidyl (meth)acrylates or further hydroxyalkyl (meth)acrylates and copolymerizing these monomers by any of the well-known methods such as, for example, the method of solution polymerization.

The alkyl (meth)acrylates mentioned above are alkyl esters of acrylic acid or methacrylic acid. The alkyl group of the alkyl esters is an aliphatic hydrocarbon radical having 1 to 6 carbon atoms. Examples of alkyl (meth)acrylates include, but are not limited to: esters of acrylic acid or methacrylic acid with methyl, ethyl, propyl, isopropyl, butyl, and hexyl.

The hydroxyalkyl (meth)acrylates mentioned above are hydroxyalkyl esters of acrylic acid or methacrylic acid. The hydroxyalkyl group of these hydroxyalkyl esters is desired to be an aliphatic hydrocarbon radical having 1 to 6 carbon atoms and containing a primary hydroxyl group. The reason for this desirability is that it is desirable to select and use a hydroxyalkyl (meth)acrylate containing a primary hydroxyl group as one of the component monomers of the aforementioned copolymer from the viewpoint of the ease with which the product of the reaction of the copolymer with (meth) acrylic acid is caused to react further with a polybasic acid anhydride. As typical examples of the hydroxyalkyl (meth) acrylates containing a primary hydroxyl group, 2-hydoxyethyl acrylate, 2-hydroxyethyl methacrylate, etc. may be cited. It should be noted, however, that these are not exclusive examples.

In the copolymer as the basis of the resin (2) mentioned above, the molar ratio of an alkyl (meth)acrylate to glycidyl (meth)acrylate is desired to be in the range of 40:60 to 80:20. In the copolymer as the basis of the resin (3) mentioned above, the molar ratio of hydroxyalkyl (meth)acrylate to an alkyl (meth)acrylate to glycidyl (meth)acrylate is desired to be in the range of 10–50:10–70:20–60, preferably in the range of 15–30:30–50:30–50. If the proportion of glycidyl (meth)acrylate to the copolymer is unduly low from the lower limit of the range mentioned above, the copolymer will be at a disadvantage in acquiring an unduly low photocuring property. Conversely, if this proportion exceeds the upper limit of the range mentioned above, the copolymer will be at a disadvantage in failing to allow the reaction of synthesis of a photosensitive resin to proceed smoothly.

In the resins (2) to (4) mentioned above, the degree of polymerization of the copolymer obtained by copolymerizing the component monomers, as expressed by weight-average molecular weight, is desired to be in the range of 10,000 to 70,000, preferably in the range of 20,000 to 60,000. If the weight-average molecular weight is less than 10,000, the composition containing the resin will be at a disadvantage in acquiring unduly low dryness to the touch of finger. Conversely, if it exceeds 70,000, the composition will be at a disadvantage in acquiring an unduly low developing property.

In the composition of the present invention, such vinyl compounds as styrene and methylstyrene may be used in a proportion not so large as to adversely affect the characteristic properties of the composition in addition to the component monomers mentioned above.

The reaction for the synthesis of the resin (5) mentioned above is attained by the first method which comprises causing (b) an unsaturated monocarboxylic acid [or (d) a compound] to react with (a) a polyfunctional epoxy compound and then causing (d) a compound [or (b) an unsaturated monocarboxylic acid] to react with the resultant reaction product or by the second method which comprises causing simultaneous reaction of (a) a polyfunctional epoxy compound, (b) an unsaturated monocarboxylic acid, and (d) a compound. Though these two methods are both available, the second method proves more advantageous.

Appropriately, the reaction mentioned above is accomplished between one equivalent weight of the epoxy group of (a) the polyfunctional epoxy compound and a total of about 0.8 to 1.3 mols, preferably about 0.9 to 1.1 mols, of (b) the unsaturated monocarboxylic acid and (d) the compound. Properly, the ratio of the amounts of (b) the unsaturated monocarboxylic acid and (d) the compound to be used is such that the amount of (d) the compound to be used may fall in the range of 0.05 to 0.5 mol, preferably 0.1 to 0.3 mol, based on 1 mol of the total of the amounts of (b) the unsaturated monocarboxylic acid and (d) the compound.

In the reaction for the synthesis of the resin (5) mentioned above, it is appropriate to use a diluent during the course of the reaction. As concrete examples of the diluent, such organic solvents as will be cited hereinbelow and such reactive monomers as carbitol (meth)acrylate, phenoxyethyl (meth)acrylate, pentaerythritol tetra(meth)acrylate, trimethylolpropane tri(meth)acrylate, tris(hydroxyethyl) isocyanurate tri(meth)acrylate, and dipentaerythritol hexa(meth) acrylate may be cited. Further, for promoting the reaction, it is appropriate to use a catalyst such as, for example, triethyl amine, benzyl dimethyl amine, methyl triethyl ammonium chloride, benzyl trimethyl ammonium bromide, benzyl trimethyl ammonium iodide, triphenyl phosphine, triphenyl stibine, chromium octanoate, and zirconium octanoate. Appropriately, the amount of the catalyst to be used is in the range of 0.1 to 10% by weight, based on the total amount of the mixture of reactants. For preventing the reaction from entraining polymerization, it is proper to use a polymerization inhibitor such as, for example, hydroquinone, methyl hydroquinone, hydroquinone monomethyl ether, catechol, and pyrogallol. The amount of the polymerization inhibitor to be used appropriately is in the range of 0.01 to 1% by weight, based on the amount of the mixture of reactants. Properly, the reaction temperature is in the range of 60° to 150° C. and the reaction time in the range of 5 to 60 hours. Thus, the reaction product (I) can be obtained.

Next, the reaction of (I) the reaction product mentioned above and (c) the polybasic acid anhydride is appropriately carried out between one equivalent weight of the hydroxyl group in the reaction product (I) and 0.1 to 0.9 equivalent weight of the polybasic acid anhydride (c). Appropriately, the reaction temperature is in the range of 60° to 150° C. and the reaction time in the range of 1 to 10 hours.

The synthesis of the unsaturated group-containing polyurethane carboxylate resin (7) mentioned above is appropriately attained by causing (I) the reaction product mentioned above to react with (c) the polybasic acid anhydride and then causing (e) the unsaturated group-containing monoisocyanate to react with the resultant reaction product. The reaction of (I) the reaction product with (c) the polybasic acid anhydride can be effected as described above. Appropriately, this reaction is followed by the reaction between one equivalent weight of the hydroxyl group in the unsaturated group-containing polycarboxylic acid resin resulting from the reaction of (I) the reaction product with (c) the polybasic acid anhydride and 0.05 to 0.5 equivalent weight of (e) the unsaturated group-containing monoisocyanate. The reaction temperature appropriately is in the range of 60° to 100° C. Properly this reaction proceeds in the presence of a small amount of a catalyst such as, for example, dibutyl tin laurate. The preferred reaction time is in the range of 5 to 15 hours.

Concrete examples of the epoxy compound (a) having at least two epoxy groups in the molecular unit thereof and used for the syntheses of the resins (1), (5), and (7) mentioned above include, but are not limited to: novolak type epoxy resins such as, for example, those which are obtained by causing such phenols as phenol, cresol, halogenated phenols, and alkyl phenols to react with formaldehyde in the presence of an acidic catalyst and then causing the resultant novolaks to react with epichlorohydrin and/or methyl epichlorohydrin and which include such commercially available substances as EOCN-103, EOCN-104S, EOCN-1020, EOCN-1027, EPPN-201, and BREN-S produced by Nippon Kayaku Co., Ltd., DEN-431 and DEN-439 produced by The Dow Chemical Company, N-730, N-770, N-865, N-665, N-673, N-695, and VH-4150 produced by Dainippon Ink and Chemicals, Inc.; bisphenol type epoxy resins such as, for example, those which are obtained by causing such bisphenols as bisphenol A, bisphenol F, bisphenol S, and tetrabromobisphenol to react with epichlorohydrin and/or methyl epichlorohydrin or by causing epichlorohydrin and/ or methyl epichlorohydrin to react with condensates of diglycidyl ether of bisphenol A with the bisphenols mentioned above and which include such commercially available substances as EPIKOTE® 1004 and EPIKOTE® 1002 produced by Yuka-Shell Epoxy K.K. and DER-330 and DER-373 produced by The Dow Chemical Company; trisphenol methane type epoxy resins such as, for example, those which are obtained by causing trisphenol methane or triscresol methane to react with epichlorohydrin and/or methyl epichlorohydrin and which include such commercially available substances as EPPN-501 and EPPN-502 produced by Nippon Kayaku Co., Ltd.; tris(2,3-epoxypropyl) isocyanurate; biphenyl diglycidyl ether; alicyclic epoxy resins; amino group-containing epoxy resins such as, for example, Celloxide 2021 produced by Daicel Chemical Industries, Ltd., Epomic VG-3101 produced by Mitsui Petrochemical Industries, Ltd., E-1031S produced by Yuka-Shell Epoxy K.K., TETRAD-X and TETRAD-C produced by Mitsubishi Gas Kagaku K.K., and EPB-13 and EPB-27 produced by Nippon Soda Co., Ltd.; copolymer type epoxy resins such as, for example, copolymer of glycidyl methacrylate with styrene and copolymers of glycidyl methacrylate with styrene and methyl methacrylate, which include CP-50M and CP-50S produced by Nippon Oils & Fats Co., Ltd., and copolymers of glycidyl methacrylate with cyclohexyl maleimide; and other epoxy resins having special structures. Among other epoxy resins mentioned above, cresol novolak type epoxy resins and phenol novolak type epoxy resins prove particularly advantageous.

Concrete examples of the unsaturated monocarboxylic acids (b) used for the synthesis of the aforementioned resins (1), (5), and (7) include, but are not limited to: acrylic acid, dimer of acrylic acid, methacrylic acid, β-styrylacrylic acid, β-furfuryl acrylic acid, crotonic acid, α-cyanocinnamic acid, cinnamic acid; half esters obtained by the reaction of a saturated or unsaturated dibasic acid anhydride with a (meth)acrylate having one hydroxyl group per molecule or by the reaction of a saturated or unsaturated dibasic acid anhydride with an unsaturated monoglycidyl compound, such as, for example, half esters obtained by causing a saturated or unsaturated dibasic acid anhydride such as succinic anhydride, maleic anhydride, phthalic anhydride, tetrahydrophtalic anhydride, hexahydrophthalic anhydride, methylhexahydrophthalic anhydride, methyltetrahydrophthalic anhydride, itaconic anhydride, and methylendomethylene tetrahydrophthalic anhydride, to react in an equimolar ratio with a (meth)acrylate having one hydroxyl group per molecule such as hydroxyethyl (meth)acrylate, hydroxypropyl (meth)acrylate, hydroxybutyl (meth) acrylate, polyethylene glycol mono(meth)acrylate, glycerin di(meth)acrylate, trimethylol propane di(meth)acrylate, pentaerythritol tri(meth)acryalte, dipentaerythritol penta(meth) acrylate, and (meth)acrylate of phenyl glycidyl ether and half esters obtained by causing a saturated or unsaturated dibasic acid such as succinic acid, maleic acid, adipic acid, phthalic acid, tetrahydrophthalic acid, itaconic acid, and fumaric acid to react in an equimolar ratio with an unsaturated monoglycidyl compound such as glycidyl (meth) acrylate and the compounds represented by the following formulae (i) to (iv). These unsaturated monocarboxylic acids may be used either singly or in the form of a combination of two or more members. Among other monocarboxylic acids cited above, acrylic acid and methacrylic acid, particularly acrylic acid, prove to be particularly desirable from the viewpoint of the photocuring property.

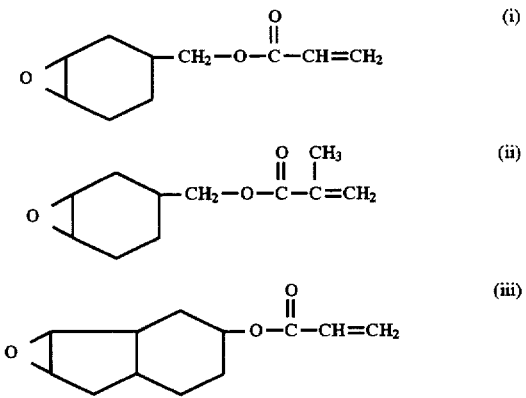

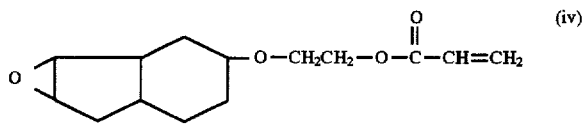

Typical examples of the saturated or unsaturated polybasic acid anhydrides (c) used for the synthesis of the aforementioned resins (1) to (3) and (5) to (7) are dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylenetetrahydrophthalic anhydride, methylendomethylenetetrahydrophthalic anhydride, chlorendic anhydride, and methyltetrahydrophthalic anhydride; aromatic polycarboxylic anhydrides such as trimellitic anhydride, pyromellitic anhydride, and benzophenone-tetracarboxylic dianhydride; and polycarboxylic anhydride derivatives thereof such as 5-(2,5-dioxotetrahydrofuryl)-3-methyl-3-cyclohexene-1, 2-dicarboxylic anhydride. Among other polybasic acid anhydrides cited above, tetrahydrophthalic anhydride and hexahydrophthalic anhydride prove to be particularly desirable.

Then, concrete examples of the compound (d) having at least two hydroxyl groups and one reactive group (such as, for example, carboxyl group or secondary amino group) other than the hydroxyl group capable of reacting with an epoxy group in the molecular unit thereof and used for the syntheses of the resins (5) and (7) mentioned above include, but are not limited to: polyhydroxy-containing monocarboxylic acids such as dimethylol propionic acid, dimethylol acetic acid, dimethylol butyric acid, dimethylol valeric acid, and dimethylol caproic acid; and dialkanol amines such as diethanol amine and diisopropanol amine.

Concrete examples of the unsaturated monoisocyanate (e) mentioned above include, but are not limited to: methacryloyl isocyanate, methacryloyl oxyethyl isocyanate, and the reaction products resulting from the reaction of organic diisocyanates (such as, for example, tolylene diisocyanate, xylylene diisocyanate, isophorone diisocyanate, and hexamethylene diisocyanate) with (meth)acrylates having one hydroxyl group in the molecular unit thereof mentioned above at a substantially equimolar ratio.

Examples of the photopolymerization initiators as the component (B) include, but are not limited to: acetophenones such as acetophenone, 2,2-dimethoxy-2-phenyl acetophenone, 2,2-diethoxy-2-phenyl acetophenone, p-dimethylaminopropiophenone, dichloroacetophenone, trichloroacetophenone, p-tertbutyl trichloroacetophenone, 1-hydroxycyclohexyl phenyl ketone, 2-methyl-1-[4-(methylthio)phenyl]-2-morpholino-propan-1-one, 2-benzyl-2-dimethylamino-1-(4-morpholinophenyl)-butan-1-one, and N,N-dimethyl-aminoacetophenone; benzophenones such as benzophenone, methylbenzophenone, 2-chlorobenzophenone, 4,4'-dichlorobenzophenone, 4,4'-bis(dimethylamino)benzophenone, 4,4'-bis(diethylamino) benzophenone, Michler's ketone, and 4-benzoyl-4'-methyldiphenyl sulfide; benzil; benzoin and ethers thereof such as benzoin methyl ether, benzoin ethyl ether, benzoin isopropyl ether, and benzoin isobutyl ether; ketals such as acetophenone dimethyl ketal and benzyl dimethyl ketal; thioxanthones such as thioxanthone, 2-chlorothioxanthone, 2,4-dimethylthioxanthone, 2,4-diethylthioxanthone, and 2,4-diisopropylthioxanthone; anthraquinones such as 2-methylanthraquinone, 2-ethyl-anthraquinone, 2-tert-butylanthraquinone, 1-chloroanthraquinone, 2-amylanthraquinone, and 2,3-diphenylanthraquinone; organic peroxides such as benzoyl peroxide and cumene peroxide; thiol compounds such as 2-mercaptobenzimidazole, 2-mercaptobenzoxazole, and 2-mercaptobenzothiazole; organic halogen compounds such as 2,2,2-tribromoethanol and tribromomethyl phenyl sulfone; 2,4,6-trimethylbenzoyl diphenyl phosphine oxide; 2,4,6-tris-S-triazine; dimer of 2,4,5-triaryl imidazole; and riboflavin tetrabutylate. These compounds may be used either singly or in the form of a combination of two or more members. Optionally, the photopolymerization initiator (B) may be used in combination with one member or a mixture of two or more members selected from the photosensitizers such as tertiary amines like N,N-(dimethylamino) ethylbenzoate, N,N-(dimethylamino)isoamyl benzoate, penthyl-4-dimethylaminobenzoate, triethyl amine, and triethanol amine.

The preferred combinations of the photopolymerization initiators (B) include the combinations of 2-methyl-1-[4-(methylthio)-phenyl]-2-morphorino-propan-1-one (such as, for example, Irgacure®907 produced by Ciba-Geigy Ltd.) with 2-chlorothioxanthone (such as, for example, Kayacure-CTX produced by Nippon Kayaku Co., Ltd.), 2,4-diethylthioxanthone (such as, for example, Kayacure-DETX produced by Nippon Kayaku Co., Ltd.), 2-isopropylthioxanthone, or 4-benzoyl-4'-methyldiphenyl sulfide, for example.

The amount of the aforementioned photopolymerization initiator (B) to be used suitably falls in the range of 0.2 to 30 parts by weight, preferably 2 to 10 parts by weight, based on 100 parts by weight of the aforementioned photosensitive prepolymer (A). If the amount of the photopolymerization initiator to be used is less than 0.2 part by weight, the composition will suffer from inferior photocuring property. Conversely, if the amount exceeds 30 parts by weight, the composition will entail the disadvantage of exhibiting inferior quality for cured film and poor stability during storage.

As the component (C) mentioned above, namely the diluent, an organic solvent and/or a photopolymerizable monomer may be used.

Examples of the organic solvents include, but are not limited to: ketones such as methyl ethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; acetates such as ethyl acetate, butyl acetate, cellosolve acetate, butyl cellosolve acetate, carbitol acetate, butyl carbitol acetate, propylene glycol monomethylether acetate, and dipropylene glycol monomethyl ether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha. These organic solvents may be used either singly or in the form of a combination of two or more members.

The organic solvent is used for the purpose of dissolving the photosensitive prepolymer (A) mentioned above, diluting the composition, allowing the composition to be applied in the from of a liquid, enabling the applied layer of the composition to form a film by the predrying, and allowing the film to be exposed to light by the so-called "contact exposure".

Though the amount of the organic solvent to be incorporated in the composition is not particularly restricted, it is properly in the approximate range of 30 to 300 parts by weight, based on 100 parts by weight of the photosenitive prepolymer (A) mentioned above. The amount of the organic solvent may be suitably set so as to fit the method of application to be selected.

Typical examples of the photopolymerizable monomers include 2-hydroxyethyl acrylate, 2-hydroxypropyl acrylate, N-vinylpyrrolidone, acryloyl morpholine, methoxytetraethylene glycol acrylate, methoxypolyethylene glycol acrylate, polyethylene glycol diacrylate, N,N-dimethyl acrylamide, N-methylol acrylamide, N,N-dimethylaminopropyl acrylamide, N,N-dimethylaminoethyl acrylate, N,N-dimethylaminopropyl acrylate, melamine acrylate, diethylene glycol diacrylate, triethylene glycol diacrylate, propylene glycol diacrylate, dipropylene glycol diacrylate, tripropylene glycol diacrylate, polypropylene glycol diacrylate, phenoxyethyl acrylate, tetrahydrofurfuryl acrylate, cyclohexyl acrylate, glycerin diglycidyl ether diacrylate, glycerin triglycidyl ether triacrylate, isobornyl acrylate, cyclopentadiene mono- or di-acrylate; polyfunctional acrylates of polyhydric alcohols such as hexane diol, trimethylol propane, pentaerythritol, ditrimethylol propane, dipentaerythritol, and tris-hydroxyethyl isocyanurate and of ethylene oxide or propylene oxide adducts thereof; methacrylates corresponding to the acrylates enumerated above; and mono-, di-, tri-, and higher polyesters of polybasic acids with hydroxyalkyl (meth)acrylates. These monomers may be used either singly or in the form of a combination of two or more members.

The aforementioned photopolymerizable monomer is used for the purpose of diluting the aforementioned photosenstive prepolymer thereby rendering the produced composition easily applicable, and imparting photopolymerizability upon the composition. The amount of the monomer to be used is desired to fall in the range of 3 to 50 parts by weight, based on 100 parts by weight of the photosensitive prepolymer (A) mentioned above. If the amount of the monomer is less than 3 parts by weight, the composition will be at a disadvantage in failing to enhance the photocuring property. Conversely, if the amount exceeds 50 parts by weight, the composition will be at a disadvantage in failing to heighten dryness of the predried film to the tack-free touch of finger.

The photocurable and thermosetting matte liquid resist composition of the present invention, besides the components described above, contains further an epoxy compound (D) having at least two epoxy groups in the molecular unit thereof as a thermosetting component. As a result, this composition can be advantageously used for the formation of various resinous insulating layers, for the use as an etching resist and a marking ink, and for the formation of a solder resist on printed circuit boards, for example.

Examples of such an epoxy compound include, but are not limited to: epoxy resins which exhibit sparing solubility in a diluent to be used, such as bisphenol S type epoxy resins represented by the product of Nippon Kayaku Co., Ltd. marketed under trademark designation of "EBPS"-200, that of Asahi Denka Kogyo K.K. under trademark designation of "EPX"-30, and that of Dainippon Ink & Chemicals, Inc. under trademark designation of "EPICLON" EXA-1514; diglycidyl terephthalate resin represented by the product of Nippon Oil and Fats Co., Ltd. under trademark designation of "BLEMMER"-DGT; heterocyclic epoxy resins represented by the products of Nissan Chemical Industries, Ltd. under trademark designation of "TEPIC" and that of Ciba-Geigy Ltd. under trademark designation of "ARALDITE" PT810; bixylenol type epoxy resins represented by the products of Yuka-Shell Epoxy K.K. under trademark designation of YX-4000; biphenol type epoxy resins represented by the products of Yuka-Shell Epoxy K.K. under trademark designation of "YL-6056"; and tetraglycidyl xylenoyl ethane resins represented by the product of Tohto Kasei Co., Ltd. under product code of ZX-1063; and epoxy resins which exhibit solubility in a diluent to be used, such as bisphenol A type epoxy resins represented by the products of Yuka-Shell Epoxy K.K. under trademark designation of "EPIKOTE" 1009 and 1031, those of Dainippon Ink and Chemicals, Inc. under trademark designation of "EPICLON" N-3050, N-7050, and N-9050, those of Asahi Chemical Industry Co., Ltd. under trademark designation of "AER"-664, "AER"-667, and "AER"-669, those of Tohto Kasei Co., Ltd. under trademark designation of "Epo Tohto" YD-012, YD-014, YD-017, YD-020, and YD-002, those of Ciba-Geigy Ltd. under trademark designation of "ARALDITE" XAC-5005, GT-7004, -6484T, and -6099; those of The Dow Chemical Company under trademark designation of "DER"-642U and "DER"-673MF, those of Asahi Denka Kogyo Co., Ltd. under product code of EP-5400 and EP-5900; hydrogenated bisphenol A type epoxy resins represented by the products of Tohto Kasei Co., Ltd. under trademark designation of "Sun Tohto" ST-2004 and ST-2007; bisphenol F type epoxy resins represented by the products of Tohto Kasei Co., Ltd. under trademark designation of "Epo Tohto" YDF-2004 and YDF-2007; brominated bisphenol A type epoxy resins represented by the products of Sakamoto Yakuhin Kogyo Co., Ltd. under product code of SR-BBS and SR-TBA-400, those of Asahi Denka Kogyo Co., Ltd. under product code of EP-62 and EP-66, those of Asahi Chemical Industry Co., Ltd. under trademark designation of "AER"-755 and "AER"-765, and those of Tohto Kasei Co., Ltd. under trademark designation of "Epo Tohto" YDB-600 and YDB-715; novolak type epoxy resins represented by the products of Nippon Kayaku Co., Ltd. under trademark designation of "EPPN"-201, "EOCN"-103, "EOCN"-1020, "EOCN"-1025, and "BREN", those of Asahi Chemical Industry Co., Ltd. under trademark designation of "AER" ECN-278, ECN-292, and ECN-299, those of Ciba-Geigy Ltd. under trademark designation of "ARALDITE" ECN-1273 and ECN-1299, those of Tohto Kasei Co., Ltd. under trademark designation of "Epo Tohto" YDCN-220L, YDCN-220HH, YDCN-702, YDCN-704, YDPN-601, and YDPN-602, and those of Dainippon Ink and Chemicals, Inc. under trademark designation of "EPICLON" N-673, N-680, N-695, N-770, and N-775; novolak type epoxy resins of bisphenol A represented by the products of Asahi Denka Kogyo Co., Ltd. under trademark designations of "EPX"-8001, "EPX"-8002, "EPPX"-8060, and "EPPX"-8061 and the product of Dainippon Ink and Chemicals, Inc. under trademark designation of "EPICLON" N-880; chelate type epoxy resins represented by the products of Asahi Denka Kogyo Co., Ltd. under trademark designation of "EPX"-49-60 and "EPX"-49-30; glyoxal type epoxy resins represented by the products of Tohto Kasei Co., Ltd. under trademark designation of "Epo Tohto" YDG-414; amino group-containing epoxy resins represented by the products of Tohto Kasei Co., Ltd. under trademark designation of "Epo Tohto" YH-1402 and "Sun Tohto" ST-110 and those of Yuka-Shell Epoxy K.K. under trademark designation of "EPIKOTE" YL-931 and YL-933; rubber-modified epoxy resins represented by the product of Dainippon Ink and Chemcials, Inc. under trademark designation of "EPICLON" TSR-601 and the products of Asahi Denka Kogyo Co., Ltd. under trademark designation of "EPX"-84-2 and "EPX"-4061; dicyclopentadiene phenolic type epoxy resins represented by the product of Sanyo-Kokusaku Pulp Co., Ltd. under trademark designation of "SK RESIN" DCE-400; silicone-modified epoxy resins represented by the product of ACR Company Ltd. under product code of X-1359; and ε-caprolactone-modified epoxy resins represented by the products of Daicel Chemical Industries, Ltd. under product code of Placcel G-402 and G-710. These epoxy resins may be used either singly or in the form of a combination of two or more members. Among other epoxy resins cited above, the finely pulverized epoxy resins which exhibit sparing solubility in a diluent to be used or a combination of the sparingly soluble epoxy resin and the soluble epoxy resin prove to be particularly desirable.

The amount of the epoxy compound to be incorporated in the composition as a thermosetting component (D) is desired to be in the range of 5 to 100 parts by weight, preferably 15 to 60 parts by weight, based on 100 parts by weight of the photosensitive prepolymer (A) mentioned above.

The matting agent (E) which is used in the photocurable and thermosetting matte liquid resist composition of the present invention is aluminum silicate having $SiO_2$ and $Al_2O_3$ as main moieties thereof. Though the ratio of combination of $SiO_2$ and $Al_2O_3$ varies with the origin of produce (mine), generally the material abounds more in $SiO_2$ and the combined content of the two moieties, $SiO_2$ and $Al_2O_3$, in the material is not less than 95%. The aluminum silicate matting agents answering this description include the species of kaolinite (kaolin clay) produced by the dry process or wet process from kaolin minerals and possessed of compositions approximating $Al_2O_3 \cdot 2SiO_2 \cdot 2H_2O$, calcined clays produced by calcining wet refined kaolinite and possessed of compositions approximating $Al_2O_3 \cdot 2SiO_2$, pyrophyllites (phyllite clay) having a three-layer structure of silicon oxide/aluminum oxide/silicon oxide produced by the wet process or dry process from clayish minerals and having compositions approximating $Al_2(OH)_2Si_4O_{10}$, and sericites having a similar three-layer structure while containing an alkali ions between the layers and having compositions approximating $K_x(Al, Mg)_2(OH)_2(Si, Al)_4O_{10} \cdot nH_{2O}$ ($x<1$). As concrete examples of the aluminum silicate, Crown Clay, Burgess Clay #60, Burgess Clay KF, and OptiWhite (produced by Shiraishi Calcium Kaisha LTD.), Kaolin JP-100, NN Kaolin Clay, ST Kaolin Clay, and Hardsil (produced by Tsuchiya Kaolin Kogyo K.K.), ASP-072, Satintonplus, Translink 37, and Hydrousdelami NCD (produced by Angel Hard Corporation), and SY Kaolin, OS Clay, HA Clay, and MC Hard Clay (produced by Maruo Calcium CO., LTD.) may be cited. These products may be used either singly or in the form of a combination of two or more members. Although kaolinite and calcined clay are different in water content, this difference brings about no appreciable difference in terms of the operation and effect aimed at by the present invention.

As is clear from the foregoing description of the function of the composition according to the present invention, the aluminum silicate matting agent (E) to be used should possess an average primary particle diameter, i.e. average particle diameter of particles not in an agglomerated state, in the range of 0.05 to 10 µm, preferably in the range of 0.5 to 8 µm, from the viewpoint of the ability to form a matte surface, to preclude infiltration of chemicals and water, and to adapt for fine patterning of a resist film.

Appropriately, the amount of the matting agent (E) to be used is in the range of 25 to 250 parts by weight, preferably 50 to 150 parts by weight, based on 100 parts by weight of the photosensitive prepolymer (A) mentioned above. If this amount is less than 25 parts by weight, the surface gloss of the resist film will increase to the extent of rendering the formation of a matte surface difficult. Conversely, if the amount exceeds 250 parts by weight, the thixotropy of the composition will increase to the extent of degrading the printability.

As the filler precipitation preventing agent (F) capable of effective adjustment of thixotropy, i.e. anti-settling agent, which is to be used in combination with the aluminum silicate matting agent (E) mentioned above, organic bentonites or organophillic bentonites having montmorillonite as a main moiety (endowed with lipophilicity by incorporation of a hydrocarbon group through the medium of a surfactant, for example, to cope with the hydrophilicity inherent in bentonite) can be advantageously used. Concrete examples of the commercially available organic bentonites include Ben-gel, Ben-gel FW, Es-ben, Es-ben 74, Organite, and Organite T (produced by Hojun Yoko K.K.), Hodaka Jirushi, Orben, 250M, Benton 34, and Benton 38 (produced by Wilbur Elis K.K.), Laponite, Laponite RD, and Laponite RDS (produced by Nippon Silica K.K.), and A-S-AT-20S, A-S-AT-350F, A-S-AD-10A, and A-S-AD-160 (produced by Ito Seiyu K.K.). These organic bentonites can be used either singly or in the form of a combination of two or more members. The organic bentonites mentioned above may be procured as dispersed in an organic solvent.

As the filler precipitation preventing agent capable of effective adjustment of thixotropy, substances which are capable of preventing the filler and the vehicle from being separated and caused to sediment may be used besides the organic bentonites mentioned above. As concrete examples of the substances, such well known filler precipitation preventing agents in popular use as fatty acid amide waxes, polyethylene oxide, amine salts of macromolecular polyesters, salts of linear polyaminoamide with macromolecular acid polyesters, amide solutions of polycarboxylic acids, alkylsulfonates, alkyl allylsulfonates, colloidal esters, aluminum stearate, zinc stearate, white carbon, lecitin, and ethyl oleate may be cited. Disparon #6900-20X, Disparon #4200, Disparon KS-873N, and Disparon #1850 (produced by Kusumoto Kasei K.K.) and BYK-405 (produced by BYC Chemie Japan K.K.) are commercially available examples of the filler precipitation preventing agent. These filler precipitation preventing agents may be procured as dispersed in an organic solvent. While these filler precipitation preventing agents can be used either singly or in the form of a combination of two or more members, they are appropriately used as combined with the organic bentonite mentioned above.

The amount to be used of the filler precipitation preventing agent (F) mentioned above, though not particularly limited because of its dependence on the amounts of the matting agent (filler) and the diluent to be incorporated, is generally in the range of 0.5 to 20 parts by weight, preferably in the range of 1 to 10 parts by weight, based on 100 parts by weight of the photosensitive prepolymer (A) mentioned above. If the amount of the filler precipitation preventing agent to be used is unduly small, the uniform dispersibility of the matting agent (filler) and the vehicle and the stability of the composition during storage will be degraded and the distribution of the matting component in the surface layer of the resist film will be impaired due to the sedimentation of the matting agent (filler) after a protracted storage or during the formation of the film in a large thickness and the matte surface aimed at will be obtained only with difficulty. Conversely, if the amount of the filler precipitation preventing agent to be used is unduly large, the characteristics of the resist film such as the hardness, resistance to chemicals, and insulating properties will be adversely affected.

The photocurable and thermosetting matte liquid resist composition obtained as described above functions fully satisfactorily as a solder resist without requiring additional use of an epoxy resin curing agent because the aforementioned photosensitive prepolymer (A) contains a hydroxyl group and/or a carboxyl group and the hydroxyl group and/or the carboxyl group in this prepolymer (A) functions as a curing agent for the epoxy resin. When the photopolymerization initiator (B) mentioned above contains an amino group-containing photo-polymerization initiator and/or photosensitizer intended for enhancement of photosensitivity, the curing of the epoxy compound (D) is further promoted by the effects of amino group of the photopolymerization initiator and the photosensitizer. For the purpose of further enhancing such characteristic properties as fast adhesiveness, resistance to chemicals, and heat resistance, however, it is desirable to use the composition as mixed with an extra curing agent for epoxy resin (G).

Examples of such an epoxy resin curing agent or curing catalyst (G) include, but are not limited to: imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole; guanamines such as guanamine, acetoguanamine, and benzoguanamine; and amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine, and melamine. These compounds may be used either singly or in the form of a combination of two or more members. The curing agents which are commercially available include products of Shikoku Chemicals Co., Ltd. marketed under trademark designation of "CUREZOL" 2MZ-A, 2MZ-OK, 2PHZ, 2P4BHZ, and 2P4MHZ (invariably imidazole type compounds) and products of Sun-Apro K.K. marketed under product codes of U-CAT 3503X, U-CAT 3502X (invariably isocyanate compounds blocked with dimethyl amine), for example. It is desired to lower the reaction starting temperature of the curing reaction by having the epoxy resin curing agent incorporated in the composition. The amount of the epoxy resin curing agent to be incorporated in the composition may be in the conventionally used range, for instance in the range of 0.01 to 10 parts by weight, preferably in the range of 0.1 to 8.0 parts by weight, based on 100 parts by weight of the photosensitive prepolymer (A) mentioned above.

The thermosetting component mentioned above may be mixed in advance with the aforementioned photocurable liquid resist composition. Since the composition containing both the thermosetting component and the photosensitive prepolymer is liable to gain in viscosity prior to being applied to a blank circuit board, however, it is proper to have them mixed immediately prior to use. To be specific, it is appropriate to prepare two separate solutions, i.e. a main component solution comprising the aforementioned photosensitive prepolymer (A) as a main component and an epoxy resin curing agent (G) added thereto and a hardener solution comprising the aforementioned epoxy compound (D) as a main component, and mix these solutions prior to use. The aforementioned photopolymerizable monomers, fillers, coloring pigments, etc. may be mixed into a solvent solution of the epoxy compound (D) as the thermosetting component.

Further, the composition of the present invention may incorporate therein, as desired, a well known and widely used inorganic filler such as barium sulfate, barium titanate, silicon dioxide power, amorphous silica, talc, magnesium carbonate, calcium carbonate, aluminum oxide, aluminum hydroxide, glass fiber, carbon fiber, and mica power for the purpose of enhancing the characteristics of the composition such as adhesion and hardness. The amount of the inorganic filler to be used is in the range of 0 to 60% by weight, preferably 5 to 40% by weight of the composition. Further, the composition may incorporate therein, as desired, a well known and widely used additive such as a coloring pigment represented by phthalocyanine blue, phthalocyanine green, Iodine Green, disazo yellow, crystal violet, titanium dioxide, carbon black, and naphthalene black; a thermopolymerization inhibitor represented by hydroquinone, hydroquinone monomethyl ether, t-butyl catechol, pyrogallol, and phenothiazine; a thickening agent represented by asbestos and finely powdered silica; an anti-foaming agent and/or leveling agent represented by silicone type, fluorine type, or macromolecular type; and an adhesiveness-imparting agent represented by imidazole type, thiazole type, triazole type, and silane couplin agent.

The photocurable and thermosetting matte liquid resist composition which is prepared in accordance with the present invention is adjusted, when necessary, to a level of viscosity suitable for the coating method, applied by the technique of screen printing, curtain coating, spray coating, roll coating, or the like to a printed circuit board having a circuit already formed thereon, for example, and then dried at a temperature in the range of 60° to 100° C., for example, thereby to evaporate the organic solvent from the coated composition and give rise to a tack-free coating film. Then, the composition coated on the printed circuit board is selectively exposed to an actinic radiation through a photomask having a prescribed pattern by the so-called "contact exposure" or "non-contact exposure" and the composition in the unexposed areas of the coating film is developed with a dilute aqueous alkali solution such as an aqueous 0.5 to 5% sodium carbonate solution to obtain a resist pattern. Thereafter, the photocured coating film is further thermally cured by subjecting to the heat treatment at a temperature in the range of from 140° to 180° C., for example. By this thermal treatment, in addition to the curing reaction of the aforementiond thermosetting components, the polymerization of the photocurable resin components is promoted and the copolymerization of this component with the thermosetting component are also facilitated so that the consequently produced resist film acquires improvements in various properties such as resistance to heat, resistance to adhesion of solder, resistance to solvents, resistance to acids, adhesiveness, resistance to electroless gold plating, electrical properties, printability, and hardness. The composition proves particularly useful for the formation of a solder resist.

As an aqueous alkali solution to be used in the process of development mentioned above, aqueous alkali solutions of potassium hydroxide, sodium hydroxide, sodium carbonate, potassium carbonate, sodium phosphate, sodium silicate, ammonia, amines, etc. can be used.

The light sources which are advantageously used for the purpose of photocuring the composition include low-pressure mercury lamp, medium-pressure mercury lamp, high-pressure mercury lamp, ultra-high-pressure mercury lamp, xenon lamp, and metal halide lamp, for example. The laser beam can be utilized as the actinic radiation for exposure of the film.

Now, the present invention will be described specifically below with reference to working examples and comparative examples. Wherever the term "parts" is used hereinbelow, it shall refer to "parts by weight" unless otherwise specified.

The raw materials used in the following working examples and comparative examples are shown in Table 1.

EXAMPLES 1–7

The main component solution of each of the examples shown in Table 2 was prepared by compounding relevant components at proportions shown correspondingly in the same table and kneading them with a three-roll mill. The hardener solution of the same example was prepared similarly by compounding relevant components at proportions shown in the same table and kneading them with the three-roll mill. A two-package type liquid resist composition thus obtained was prepared for use by mixing the main component solution and the hardener solution.

Comparative Examples 1 to 5

Two-package type liquid resist compositions of Comparative Examples 1 to 5 shown in Table 3, each consisting of a main component solution and a hardener solution, were prepared in the same manner as in Examples 1 to 7 using relevant components at proportions both shown in the same table for the purpose of comparison with the liquid resist compositions according to the present invention.

TABLE 1

| Raw materials compounded | | Trademark designations or chemical names | Average particle diameter (μm) |
|---|---|---|---|
| Main component solution | | | |
| Matting agent | A | Burgess Clay #60 | 0.8 |
| | B | Burgess Clay KE | 1.0 |
| | C | Satintonplus | 2.0 |
| Filler | D | Ultrafine anhydrous silica (AEROSIL ® #380, product of Nippon Aerosil Co., Ltd.) | 0.007 |
| | E | Talc (LMS#200, product of Maruo Calcium Co., LTD.) | 1.5–1.8 |
| | F | Molten silica (Crystalite A-1, product of Tatsumori K.K.) | 20 |
| Filler | G | Precipitated barium sulfate (product of Tsuchiya Kaolin Kogyo K.K.) | 0.5–0.6 |
| Filler precipitation preventing agent | | Benton 38 | |
| Photosensitive prepolymer | | Resin obtained by adding 0.5 mol of tetrahydrophthalic anhydride to each of the hydroxyl groups possessed by the equimolar reaction product of cresol novolak type epoxy resin (N-695) with acrylic acid | |
| Photopolymerization initiator A | | 2-Methyl-1-[4-(methylthio)phenyl]-2-morpholino-propan-1-one | |
| Photopolymerization initiator B | | 2-Chlorothioxanthone | |
| Diluent | | Dipropylene glycol monomethyl ether | |
| Epoxy resin curing catalyst | | Dicyandiamide | |
| Coloring pigment | | Phthalocyanine green | |
| Anti-foaming agent | | Silicone type anti-foaming agent (KS-66, product of Shinetsu Chemical Industry Co., Ltd.) | |
| Additive | | BYK-110 (product of BYC Chemie Japan K.K.) | |
| Hardener solution | | | |
| Photopolymerizable monomer | | Dipentaerythritol hexaacrylate | |
| Epoxy resin | | Triglycidyl isocyanurate (TEPIC ®, product of Nissan Chemical Industries, Ltd.) | |
| Diluent | | Dipropylene glycol monomethyl ether | |

TABLE 2

Example

| Formulation | | 1 | 2 | 3 | 4 | 5 | 6 | 7 |
|---|---|---|---|---|---|---|---|---|
| Main component solution | | | | | | | | |
| Matting agent | Kind | A | A | A | A | A | B | C |
| | Amount used (part) | 25 | 50 | 100 | 250 | 250 | 100 | 100 |
| Filler | Kind | G | — | — | — | — | — | — |
| | Amount used (part) | 75 | 0 | 0 | 0 | 0 | 0 | 0 |
| Filler precipitation preventing agent | Amount used (part) | 5 | 5 | 5 | 5 | 5 | 5 | 5 |
| Photosensitive prepolymer (as solids) | Amount used (part) | 100 | 100 | 100 | 100 | 100 | 100 | 100 |
| Photopolymerization initiator A | Amount used (part) | 10 | 10 | 10 | 10 | 10 | 10 | 10 |
| Photopolymerization initiator B | Amount used (part) | 5 | 5 | 5 | 5 | 5 | 5 | 5 |
| Diluent | Amount used (part) | 70 | 70 | 70 | 100 | 100 | 70 | 70 |
| Epoxy resin curing catalyst | Amount used (part) | 0.5 | 0.5 | 0.5 | 0.5 | 0.5 | 0.5 | 0.5 |
| Coloring pigment | Amount used (part) | 1 | 1 | 1 | 1 | 1 | 1 | 1 |
| Anti-foaming agent | Amount used (part) | 0.5 | 0.5 | 0.5 | 0.5 | 0.5 | 0.5 | 0.5 |
| Additive | Amount used (part) | 0 | 0 | 0 | 0 | 5 | 0 | 0 |
| Hardener solution | | | | | | | | |
| Photopolymerizable monomer | Amount used (part) | 15 | 15 | 15 | 15 | 15 | 15 | 15 |
| Epoxy resin | Amount used (part) | 25 | 25 | 25 | 25 | 25 | 25 | 25 |
| Diluent | Amount used (part) | 30 | 30 | 30 | 30 | 30 | 30 | 30 |

TABLE 3

| | | Comparative Example | | | | |
|---|---|---|---|---|---|---|
| Formulation | | 1 | 2 | 3 | 4 | 5 |
| Main component solution | | | | | | |
| Matting agent or filler | Kind | — | A | D | E | F |
| | Amount added (part) | 0 | 100 | 20 | 50 | 100 |
| Filler | Kind | G | — | — | — | — |
| | Amount added (part) | 100 | 0 | 0 | 0 | 0 |
| Filler precipitation preventing agent | Amount added (part) | 5 | 0 | 0 | 0 | 0 |
| Photosensitive prepolymer (as solids) | Amount added (part) | 100 | 100 | 100 | 100 | 100 |
| Photopolymerization initiator A | Amount added (part) | 10 | 10 | 10 | 10 | 10 |
| Photopolymerization initiator B | Amount added (part) | 5 | 5 | 5 | 5 | 5 |
| Diluent | Amount added (part) | 70 | 70 | 70 | 70 | 70 |
| Epoxy resin curing catalyst | Amount added (part) | 0.5 | 0.5 | 0.5 | 0.5 | 0.5 |
| Coloring pigment | Amount added (part) | 1 | 1 | 1 | 1 | 1 |
| Anti-foaming agent | Amount added (part) | 0.5 | 0.5 | 0.5 | 0.5 | 0.5 |
| Additive | Amount added (part) | 0 | 0 | 0 | 0 | 0 |
| Hardener solution | | | | | | |
| Photopolymerizable monomer | Amount added (part) | 15 | 15 | 15 | 15 | 15 |
| Epoxy resin | Amount added (part) | 25 | 25 | 25 | 25 | 25 |
| Diluent | Amount added (part) | 30 | 30 | 30 | 30 | 30 |

TEST EXAMPLES

The liquid resist compositions obtained in Examples 1 to 7 and Comparative Examples 1 to 5 as described above were tested for the following items and the results were rated.

(1) Printability

A sample liquid resist composition was printed on a substrate, B package of the IPC standard, with a PET (polyethylene terephthalate) screen of 100 meshes by the use of a printing machine (produced by Seria K.K.). The intervals between circuits on the resultant cured film were observed under a light microscope (30 magnifications) to determine and rate the occurrence of bubbles and print skips on the following scales.

Bubbles:

○: Perfect film with no discernible bubble

Δ: Presence of slightly discernible bubbles

X: Presence of conspicuously discernible bubbles

Skips:

○: Perfect film with no discernible skip

Δ: Presence of slightly discernible skips

X: Presence of conspicuously discernible skips

The sample liquid resist compositions were stored for six months and thereafter were tested in the same manner as above. The results are shown in Table 4 under the title of "Aging."

(2) Gloss

A given liquid resist composition sample was applied in a thickness of 20 μm on substrates to prepare five test pieces. The surfaces of these test pieces were measured for specular reflectance at 60 degrees with Microtrigloss (produced by BYC Chemie Japan K.K.). The specular reflectance at 60 degrees was expressed with an integer which was obtained by half-adjusting the first digit after the decimal point of the average found for the test pieces by the measurement.

The sample liquid resist compositions were stored for six months and thereafter were tested in the same manner as above. The results are shown in Table 4 under the title of "Aging."

(3) Resistance to Adhesion of Solder

A given liquid resist composition sample was applied on a copper-clad substrate throughout the entire surface thereof by screen printing and the applied layer of the sample was dried at 80° C. for 30 minutes to form a tuck-free film. The substrate was exposed to light according to a prescribed pattern through a negative film superposed thereon and then developed with an aqueous 1 wt % $Na_2CO_3$ solution under a spray pressure of 1.5 kg/cm² to form a pattern. This substrate was thermally cured at 150° C. for 40 minutes to produce a test substrate.

By the use of a flow soldering device (produced by Tokyo Seisan Gijutsu K.K.), the test substrate produced as described above as provided with a resist film, 20 μm in thickness, was subjected in the open air, without being coated with flux, to soldering. The soldering was carried out by the wave soldering process under the conditions of a solder temperature of 260° C., double wave, and a conveyor speed of 1.4 m/minute. Then the surface of the resist film was visually examined to determine the condition of adhesion of solder thereto and the degree of adhesion was rated on the following two-point scale.

○: Perfect surface with no discernible adhesion of solder

X: Discernible adhesion of solder in the form of thorns and a cobweb

The sample liquid resist compositions were stored for six months and thereafter were tested in the same manner as above. The results are shown in Table 4 under the title of "Aging."

(4) TI Value

A given liquid resist composition sample was measured for viscosity with a viscometer, type E, (produced by Toki Sangyo K.K.) under the conditions of 0.2 ml, a 3°×R9.7 cone, and 25° C., using revolution numbers of 5 rpm and 50 rpm. The magnitude of TI value was calculated according to the following formula, using the results of the measurement. The TI value was expressed with the numerical value of the first digit after the decimal point obtained by half-adjusting the second digit after the decimal point of the average found for the test pieces by the measurement.

TI value=Value at 5 rpm/value at 50 rpm (5) Resistance to Electroless Gold Plating Preparation of a Test Substrate:

A given liquid resist composition sample was applied on the entire surface of a copper-clad substrate having a patterned circuit formed previously thereon by screen printing and the applied layer of the sample was dried at 80° C. for 30 minutes to form a tuck-free film. The substrate was exposed to light according to a prescribed solder resist pattern through a negative film superposed thereon and then developed with an aqueous 1 wt % $Na_2CO_3$ solution under a spray pressure of 1.5 kg/cm² to form a resist pattern. This substrate was thermally cured at 150° C. for 40 minutes to produce a test substrate.

Method for Electroless Gold Plating:

The test substrate prepared as described above was degreased by dipping in an acidic degreasing solution (a 20% by vol. solution of Metex L-5B manufactured by Fuji Chemical Industries Co., Ltd.) at 30° C. for 3 minutes and then washed with water by dipping in running water for 3 minutes. Next, the test substrate was subjected to soft etching by dipping in an aqueous 14.3 wt % ammonium persulfate solution at room temperature for 3 minutes and then washed with water by dipping in running water for 3 minutes. After dipping in an aqueous 10% by vol. sulfuric acid solution for one minute at room temperature, the test substrate was washed with water by dipping in running water for 30 seconds to one minute. Then it was dipped in a catalyst solution (a 10% by vol. aqueous solution of Metal Plate Activator 350 manufactured by Meltex Inc.) at 30° C. for 7 minutes to thereby add the catalyst thereto and then washed with water by dipping in running water for 3 minutes. This test substrate having the catalyst added thereto was subjected to electroless nickel plating by dipping in a nickel plating solution (a 20% by vol. aqueous solution of Melplate Ni-865M, manufactured by Meltex Inc., pH 4.6) at 85° C. for 20 minutes. After dipping in an aqueous 10% by vol. sulfuric acid solution at room temperature for one minute, the test substrate was washed with water by dipping in running water for 30 seconds to one minute. Next, the test substrate was subjected to electroless gold plating by dipping in a gold plating solution (an aqueous solution of 15% by vol. of Aurolectroless UP manufactured by Meltex Inc. and 3% by vol. of gold potassium cyanide, pH 6) at 95° C. for 10 minutes. Then it was washed with water by dipping in running water for 3 minutes and with hot water by dipping in hot water at 60° C. for 3 minutes. After sufficient washing with water, thorough draining, and drying, an electroless gold plated test substrate was obtained.

Resistance to Electroless Gold Plating:

After a given test substrate was plated with gold as described above, a cellophane adhesive tape was applied to the plated test substrate and was then peeled therefrom. Then the test substrate was examined to determine the presence or absence of peeling of the resist layer and the presence or absence of infiltration of the plating liquid into the interface between the substrate and the resist layer on the following scale.

○: Total absence of discernible change

Δ: Slight peeling of resist layer and discernible sign of infiltration

X: Clear peeling of resist layer (6) HHBT

A substrate, B package of the IPC standard, having a given liquid resist composition applied thereon by screen printing was continuously charged at a voltage of 100 V for seven days in an ambience of the conditions of 85° C. and 90% RH. Then, the circuits on the substrate were observed under a light microscope (30 magnifications) and the results of this observation were rated on the following scale.

○: Perfect film with no discernible abnormality

Δ: Slight discernible discoloration found on the film

X: Conspicuous sign of discoloration and swelling found on the film (7) Shape of Pattern A given liquid resist composition sample was applied on a copper-clad substrate throughout the entire surface thereof by screen printing and the applied layer of the sample was dried at 80° C. for 30 minutes to form a tuck-free film. The substrate was exposed to light according to a prescribed pattern through a negative film of a nonimage part/image part ratio of 100 μm/50 μm superposed thereon and then developed with an aqueous 1 wt % $Na_2CO_3$ solution under a spray pressure of 1.5 kg/cm² to form a pattern. The lateral wall of the film on the substrate was observed under a light microscope (30 magnifications) and the results of this observation were rated on the following scale.

○: Perfect linear pattern in the wall

Δ: Slight protrusion of filler observed in the wall

X: Conspicuous protrusion of filler observed in the wall and no linear pattern obtained The results of the tests described above are collectively shown in Table 4.

erties on a par with those of the liquid resist compositions of the present invention but, after a protracted storage, a resist film which had high gloss and exhibited deficiency in resistance to adhesion of solder. The liquid resist composition of Comparative Example 1 which used precipitating barium sulfate, in spite of the use of a filler precipitation preventing agent in combination therewith, barely produced a resist film having high gloss and betraying deficiency in resistance to adhesion of solder both during the initial stage of life and after protracted storage. The liquid resist composition of Comparative Example 3 which used ultrafine particles of anhydrous silica and that of Comparative Example 4 which used talc showed relatively large changes in thixotropy, betrayed deficiency in printability and resistance to electroless gold plating, and exhibited inferior printability after protracted storage, and barely produced a resist film having high gloss and inferior resistance to adhesion of solder. While the liquid resist composition of Comparative Example 5 which used molten silica of a large particle diameter excelled in stability during storage, the resist film produced with this composition was deficient not only in resistance to electroless gold plating and in electrical insulating properties but also in the ability to form fine patterns.

While certain specific working examples have been disclosed herein, the invention may be embodied in other

TABLE 4

| | | Results of rating | | | | | | | | | | |
|---|---|---|---|---|---|---|---|---|---|---|---|---|
| | | Example | | | | | | | Comparative Example | | | | |
| Properties | | 1 | 2 | 3 | 4 | 5 | 6 | 7 | 1 | 2 | 3 | 4 | 5 |
| Initial | | | | | | | | | | | | | |
| Print- | Bubbles | ○ | ○ | ○ | Δ | ○ | ○ | ○ | ○ | ○ | X | X | |
| ability | Skips | ○ | ○ | ○ | Δ | ○ | ○ | ○ | ○ | ○ | X | Δ | ○ |
| Gloss | | 27 | 21 | 9 | 3 | 5 | 9 | 8 | 89 | 10 | 11 | 30 | 35 |
| Resistance to adhesion of solder | | ○ | ○ | ○ | ○ | ○ | ○ | ○ | X | ○ | ○ | ○ | ○ |
| TI value | | 1.2 | 1.2 | 1.3 | 1.4 | 1.3 | 1.3 | 1.3 | 1.2 | 1.2 | 2.1 | 1.6 | 1.2 |
| Resistance to electroless gold plating | | ○ | ○ | ○ | Δ | ○ | ○ | ○ | ○ | ○ | X | Δ | X |
| HHBT | | ○ | ○ | ○ | Δ | ○ | ○ | ○ | ○ | ○ | Δ | Δ | X |
| Shape of pattern | | ○ | ○ | ○ | Δ | ○ | ○ | ○ | ○ | ○ | Δ | ○ | X |
| Aging | | | | | | | | | | | | | |
| Print- | Bubbles | ○ | ○ | ○ | Δ | ○ | ○ | ○ | ○ | ○ | Δ | Δ | ○ |
| ability | Skips | ○ | ○ | ○ | ○ | ○ | ○ | ○ | ○ | ○ | Δ | ○ | ○ |
| Gloss | | 30 | 22 | 9 | 3 | 5 | 10 | 8 | 93 | 73 | 61 | 78 | 34 |
| Resistance to adhesion of solder | | ○ | ○ | ○ | ○ | ○ | ○ | ○ | X | X | X | X | ○ |

It is clearly noted from the results shown in Table 4 that the liquid resist compositions of Examples 1 to 7 according to the invention showed only sparing changes in thixotropy (as evinced by small TI values) and excelled in printability and ability to form fine patterns and that the resist films made thereof were matte films of low gloss excelling in resistance to adhesion of solder, resistance to electroless gold plating, electrical insulating properties, and fast adhesiveness. The liquid resist compositions also exhibited excellent printability even after protracted storage and produced matte resist films of low gloss which manifested excellent resistance to adhesion of solder.

The liquid resist composition of Comparative Example 2 which used an aluminum silicate matting agent and avoided using a filler precipitation preventing agent produced, during the initial stage of life, a resist film which exhibited propspecific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A photocurable and thermosetting matte liquid resist composition developable with an aqueous alkali solution, comprising in combination:

(A) a photocurable and thermosetting mate liquid resist composition with at least two ethylenically unsaturated bonds, (B) a photo polymerization initiator, (C) a diluent, (D) an epoxy compound having at least two epoxy groups, and further (E) a finely pulverized aluminum silicate matting agent having an average primary particle diameter in the range of 0.05 to 10 μm in combination with (F) a filler precipitation preventing agent.

2. The composition according to claim 1, which further comprises (G) an epoxy resin curing agent.

3. The composition according to claim 1, wherein said matting agent (E) is at least one member selected from the group consisting of kaolinite, calcined clay, pyrophyllite, and sericite.

4. The composition according to claim 1, wherein said matting agent (E) is present in an amount of 25 to 250 parts by weight, based on 100 parts by weight of said photosensitive prepolymer (A).

5. The composition according to claim 1, wherein said filler precipitation preventing agent (F) is organophilic bentonite containing montmorillonite as a principal component thereof.

6. The composition according to claim 1, wherein said filler precipitation preventing agent (F) is at least one member selected from the group consisting of fatty acid amide waxes, polyethylene oxide, amine salts of macromolecular polyesters, salts of linear polyaminoamide with macromolecular acid polyesters, amide solutions of polycarboxylic acids, alkylsulfonates, alkyl allylsulfonates, colloidal esters, aluminum stearate, zinc stearate, white carbon, lecitin, ethyl oleate, and organophilic bentonite.

7. The composition according to claim 1, wherein said filler precipitation preventing agent (F) is present in an amount of 0.5 to 20 parts by weight, based on 100 parts by weight of said photosensitive prepolymer (A).

8. The composition according to claim 1, wherein said photosensitive prepolymer (A) is a compound selected from the group consisting of (1) a reaction product obtained by reacting a polyfunctional epoxy compound with an unsaturated monocarboxylic acid to form an esterified product and subsequently reacting the esterified product with a saturated or unsaturated polybasic acid anhydride, (2) a reaction product obtained by reacting (meth)acrylic acid with a copolymer composed of an alkyl (meth)acrylate and a glycidyl (meth)acrylate and subsequently reacting the resultant reaction product with a saturated or unsaturated polybasic acid anhydride, (3) a reaction product obtained by reacting (meth)acrylic acid with a copolymer composed of a hydroxyalkyl (meth)acrylate, an alkyl (meth)acrylate, and a glycidyl (meth)acrylate and subsequently reacting the resultant product with a saturated or unsaturated polybasic acid anhydride, (4) a reaction product obtained by partially reacting a glycidyl (meth)acrylate with a copolymer composed of an alkyl (meth)acrylate and (meth)acrylic acid, (5) a reaction product obtained by causing a saturated or unsaturated polybasic acid anhydride to react with a reaction product of a polyfunctional epoxy compound, an unsaturated monocarboxylic acid, and a compound having at least two hydroxyl groups and one other reactive group other than a hydroxyl group capable of reacting with an epoxy group in the molecular unit thereof, (6) a reaction product obtained by causing a hydroxyalkyl (meth)acrylate to react with a copolymer of an unsaturated polybasic acid anhydride and an aromatic hydrocarbon having a vinyl group, and (7) a reaction product obtained by causing a saturated or unsaturated polybasic acid anhydride and an unsaturated group-containing monoisocyanate to react with a reaction product of a polyfunctional epoxy compound, an unsaturated monocarboxylic acid, and a compound having at least two hydroxyl groups and one other reactive group other than a hydroxyl group capable of reacting with an epoxy group in the molecular unit thereof.

9. The composition according to claim 1, wherein said photopolymerization initiator (B) is at least one compound selected from the group consisting of acetophenones, benzophenones, benzoin and alkyl ethers thereof, ketals, thioxanthones, anthraquinones, organic peroxides, thiol compounds, and organic halogen compounds and present in an amount of 0.2 to 30 parts by weight, based on 100 parts by weight of said photosensitive prepolymer (A).

10. The composition according to claim 1, wherein said diluent (C) is an organic solvent and present in an amount of 30 to 300 parts by weight, based on 100 parts by weight of said photosensitive prepolymer (A).

11. The composition according to claim 1, wherein said diluent (C) is a photopolymerizable monomer and present in an amount of 3 to 50 parts by weight, based on 100 parts by weight of said photosensitive prepolymer (A).

12. The composition according to claim 1, wherein said epoxy compound (D) is an epoxy resin selected from the group consisting of bisphenol S epoxy resins, diglycidyl terephthalate resin, heterocyclic epoxy resins, bixylenol epoxy resins, biphenol epoxy resins, tetraglycidyl xylenoyl ethane resins, bisphenol A epoxy resins, hydrogenated bisphenol A epoxy resins, bisphenol F epoxy resins, brominated bisphenol A epoxy resins, novolak epoxy resins, novolak epoxy resins of bisphenol A, chelate epoxy resins, glyoxal epoxy resins, amino group-containing epoxy resins, rubber-modified epoxy resins, dicyclopentadiene phenolic epoxy resins, silicone-modified epoxy resins, and ε-caprolactone-modified epoxy resins, or a mixture thereof.

13. The composition according to claim 1, wherein said epoxy compound (D) is present in an amount of 5 to 100 parts by weight, based on 100 parts by weight of said photosensitive prepolymer (A).

14. The composition according to claim 1, which further comprises a coloring pigment.

15. The composition according to claim 1, which further comprises an anti-foaming agent or a leveling agent.

16. The composition according to claim 1, wherein said epoxy compound (D) is a mixture of (a) an epoxy resin selected from the group consisting of bisphenol S epoxy resins, diglycidyl terephthalate resin, heterocyclic epoxy resins, bixylenol epoxy resins, biphenol epoxy resins, and tetraglycidyl xylenoyl ethane resins with (b) another epoxy resin selected from the group consisting of bisphenol A epoxy resins, hydrogenated bisphenol A epoxy resins, bisphenol F epoxy resins, brominated bisphenol A epoxy resins, novolak epoxy resins, novolak epoxy resins of bisphenol A, chelate epoxy resins, glyoxal epoxy resins, amino group-containing epoxy resins, rubber-modified epoxy resins, dicyclopentadiene phenolic epoxy resins, silicone-modified epoxy resins, and ε-caprolactone-modified epoxy resins.

17. The composition according to claim 1, wherein said epoxy compound (D) is a first epoxy resin which exhibits sparing solubility in the diluent (C) to be used or a mixture thereof with a second epoxy resin which is soluble in the diluent (C).

* * * * *